(12) United States Patent
Alberti et al.

(10) Patent No.: US 8,086,348 B2
(45) Date of Patent: Dec. 27, 2011

(54) METHOD OF TRANSFERRING A SUBSTRATE, TRANSFER SYSTEM AND LITHOGRAPHIC PROJECTION APPARATUS

(75) Inventors: Jozef Augustinus Maria Alberti, Nederweert (NL); Gerardus Petrus Matthijs Van Nunen, Berghem (NL); Frans Erik Groensmit, Helmond (NL); Rene Theodorus Petrus Compen, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 472 days.

(21) Appl. No.: 12/248,290

(22) Filed: Oct. 9, 2008

(65) Prior Publication Data
US 2009/0155026 A1    Jun. 18, 2009

Related U.S. Application Data

(60) Provisional application No. 60/960,701, filed on Oct. 10, 2007.

(51) Int. Cl.
*G06F 7/00* (2006.01)

(52) U.S. Cl. .................................. 700/228; 700/218

(58) Field of Classification Search .................. 700/228, 700/218; 355/53, 72, 73, 74, 75, 76; 378/34, 378/35; 396/611
See application file for complete search history.

(56) References Cited

U.S. PATENT DOCUMENTS

| | | | |
|---|---|---|---|
| 5,788,868 A * | 8/1998 | Itaba et al. | 216/41 |
| 6,225,012 B1 | 5/2001 | Nishi et al. | |
| 6,577,382 B2 * | 6/2003 | Kida et al. | 355/77 |
| 2002/0002422 A1 * | 1/2002 | Kondo et al. | 700/228 |
| 2005/0095116 A1 * | 5/2005 | Kitayama | 414/935 |

FOREIGN PATENT DOCUMENTS

| | | |
|---|---|---|
| JP | 07-074084 A | 3/1995 |
| JP | 09-186061 A | 7/1997 |
| JP | 2000-077314 A | 3/2000 |
| JP | 2002-280288 A | 9/2002 |
| JP | 2007-193197 A | 8/2007 |
| WO | WO 2006/057299 A1 | 6/2006 |

OTHER PUBLICATIONS

English Language Abstract for Japanese Pub. No. 2007-193197A, filed Jan. 20, 2006, 3 pgs.
Office Action dated Sep. 30, 2010, Korean Patent Appl. No. 10-2008-0099578, 1 pg.
English language Abstract of Japanese Patent Publication No. 07-074084 A, Published Mar. 17, 1995, the Japanese Patent Office; 1 page.

(Continued)

*Primary Examiner* — Ramya Prakasam
(74) *Attorney, Agent, or Firm* — Sterne, Kessler, Goldstein & Fox P.L.L.C.

(57) ABSTRACT

A method is provided for transferring a substrate from a first substrate holder, e.g., a pre-alignment unit, to a second substrate holder, e.g., a substrate table in a lithographic apparatus, by means of a transfer unit on the basis of transfer data available thereto. First, the substrate is provided on the first substrate holder. Subsequently, a position error of the substrate is measured, and positioning adjustment data are calculated based on the position error as measured. Then, the second substrate holder is moved relative to a reference position thereof in accordance with the positioning adjustment data. Finally, the substrate is transferred by means of the transfer unit from the first substrate holder to the second substrate holder in accordance with the transfer data, and placed on the second substrate holder as moved.

14 Claims, 5 Drawing Sheets

OTHER PUBLICATIONS

Figure 1:
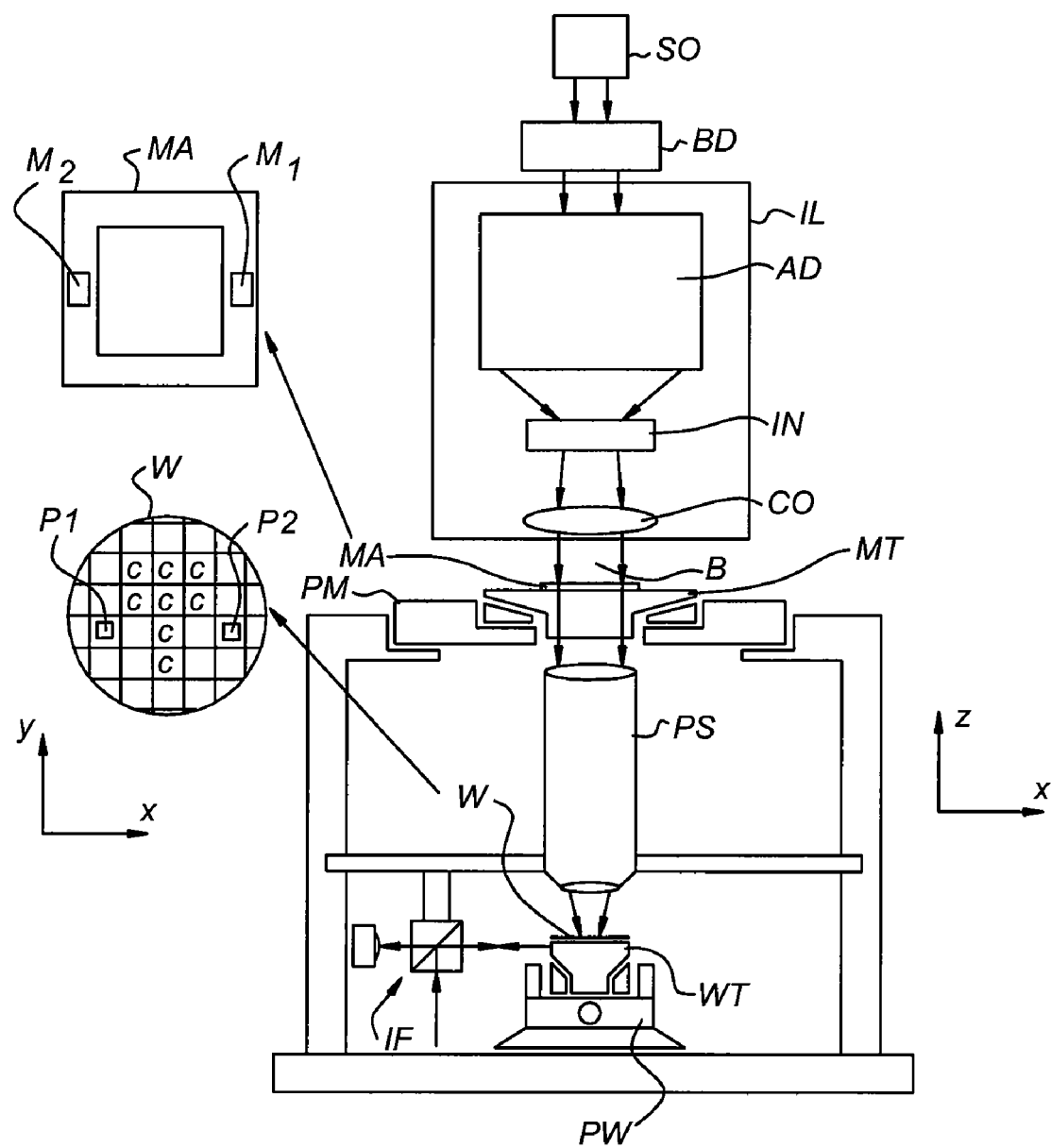

English language Abstract of Japanese Patent Publication No. 09-186061 A, published Jul. 15, 1997, the Japanese Patent Office; 1 page.

English language Abstract of Japanese Patent Publication No. 2000-077314 A, published Mar. 14, 2000, the Japanese Patent Office; 1 page.

English language Abstract of Japanese Patent Publication No. 2002-280288 A, published Sep. 27, 2002, the Japanese Patent Office; 1 page.

English translation of Japanese Notice of Reasons for Rejection directed to related Japanese Patent No. 2008-262638 A, mailed Jun. 20, 2011 form the Japanese Patent Office; 3 pages.

* cited by examiner

METHOD OF TRANSFERRING A SUBSTRATE, TRANSFER SYSTEM AND LITHOGRAPHIC PROJECTION APPARATUS

CROSS-REFERENCE TO RELATED APPLICATION

This application claims the benefit of the filing date of U.S. Provisional Application 60/960,701 filed on Oct. 10, 2007. The subject matter of that application is incorporated herein by reference as if fully set forth herein.

BACKGROUND OF THE INVENTION

1. Field of the Invention

The present invention relates to a method of transferring a substrate from a first substrate holder to a second substrate holder by means of a transfer unit on the basis of transfer data available thereto and a computer readable medium encoded with computer executable code causing a processor-based system to enable and control such a method. The invention further relates to a transfer system for transferring a substrate on the basis of transfer data, a lithographic projection apparatus comprising such a transfer system, a device manufacturing method using such a lithographic projection apparatus and a computer readable medium encoded with computer executable code for enabling execution of aforementioned device manufacturing method.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In device manufacturing methods using lithographic apparatus, an important factor in the yield, i.e., the percentage of correctly manufactured devices, is the accuracy within which layers are printed in relation to layers that have previously been formed. This is known as overlay and the overlay error budget will often be 10 nm or less. To achieve such accuracy, the substrate should be aligned to the mask pattern to be transferred with great accuracy.

In order to achieve good image definition and layer overlay the irradiated surface of a substrate should be positioned accurately on supporting surface, i.e., a substrate holder, and be kept on the substrate holder as flat and as stationary as possible during exposure. Generally, for this purpose, the substrate holder is provided with a plate comprising a plurality of protrusions, also referred to as burls or pimples. On such a substrate holder, a substrate can be placed so that its backside is in contact with the burls, all of which lie in a well-defined plane. By connecting aperture(s) in the substrate holder to a vacuum generating device, the backside of the substrate can be clamped securely against the burls. The use of burls in this manner ensures that only a fraction of the area of the backside is actually pressed against a solid surface; in this way, the distorting effect of any particulate contamination on the backside of the wafer is minimized, since such contamination will most probably be situated in the empty spaces between burls rather than being pressed against the top surface of a burl.

However, if the substrate is fixed to the substrate table as described above, the substrate will bend over the burls. As a result, an image being exposed on the substrate will shift locally. When the substrate after development is again positioned on the substrate table for a second exposure, due to a different position with respect to the burls, the local image shift will be different during the second exposure than during the first exposure. Consequently, an overlay error has been introduced.

With the continual desire to image ever smaller patterns to create device with higher component densities, there is pressure to reduce overlay errors, which leads to a desire for improved placement of a substrate on a substrate table provided with burls.

BRIEF SUMMARY OF THE INVENTION

It is desirable to provide a method of transferring a substrate and a transfer system with an improved placement accuracy than hitherto known. To that end, the invention provides a method of transferring a substrate from a first substrate holder to a second substrate holder by means of a transfer unit on the basis of transfer data available thereto. First, the substrate is provided on the first substrate holder. A position error of the substrate is measured. Positioning adjustment data is calculated based on the position error as measured. The second substrate holder is moved relative to a reference position thereof in accordance with the positioning adjustment data. The substrate is transferred by means of the transfer unit from the first substrate holder to the second substrate holder in accordance with the transfer data. The substrate is placed on the second substrate holder as moved.

In an embodiment, the invention provides a computer readable medium encoded with computer executable code, which, when loaded on a computer assembly, enables the computer assembly to control the method of transferring as described above.

Additionally, in an embodiment, the invention provides a transfer system for transferring a substrate on the basis of transfer data available thereto, the transfer system includes a first substrate holder configured to hold the substrate. A position sensor is configured to measure a position error of the substrate positioned on the first substrate holder. A second substrate holder is configured to hold the substrate. A transfer unit is configured to transfer the substrate from the first substrate holder to the second substrate holder in accordance with the transfer data. A processor communicates with the position sensor and calculates positioning adjustment data based on the position error as measured. A control unit communicates with the processor and is configured to move the second substrate holder relative to a reference position thereof in accordance with the positioning adjustment data as calculated.

Additionally, in an embodiment, the invention provides a lithographic projection apparatus. An illumination system is configured to provide a beam of radiation. A support structure is configured to support a patterning device that serves to impart the beam of radiation with a pattern in its cross-section. A substrate table is configured to hold a substrate. A projection system is configured to expose the patterned beam on the substrate. The lithographic apparatus further includes a transfer system as described above, and the substrate table is the second substrate holder.

In an embodiment, the invention provides a device manufacturing method comprising projecting a patterned beam of radiation onto a substrate using the lithographic projection apparatus as described above.

In an embodiment, the invention provides a computer readable medium encoded with computer executable code, which, when loaded on a computer assembly, enables the computer assembly to control the device manufacturing method as described above.

BRIEF DESCRIPTION OF THE DRAWINGS/FIGURES

Figure 2A:
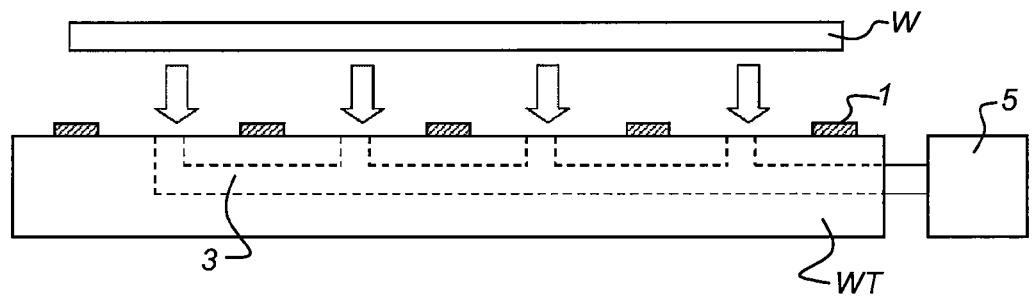
Figure 2B:
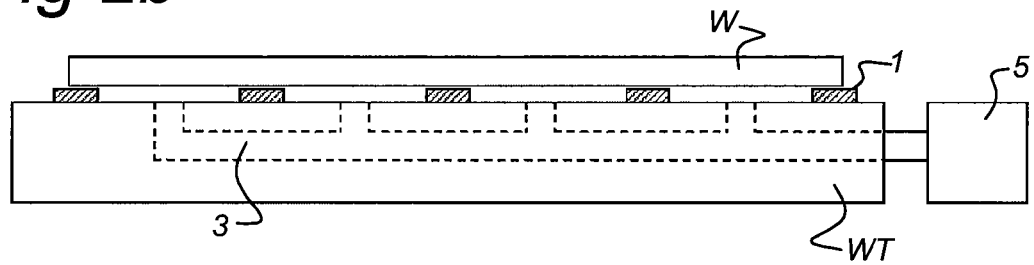
Figure 2C:
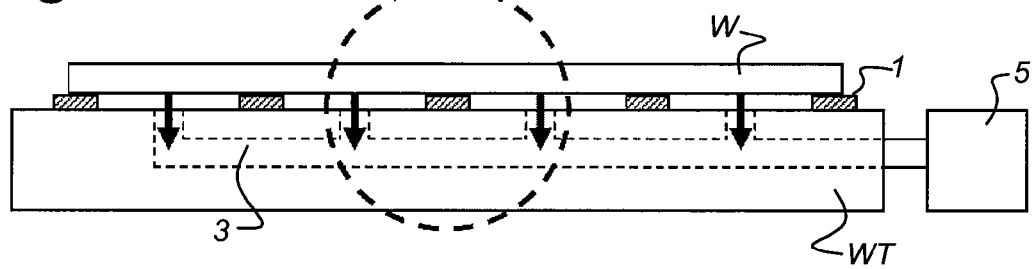
Figure 2D:
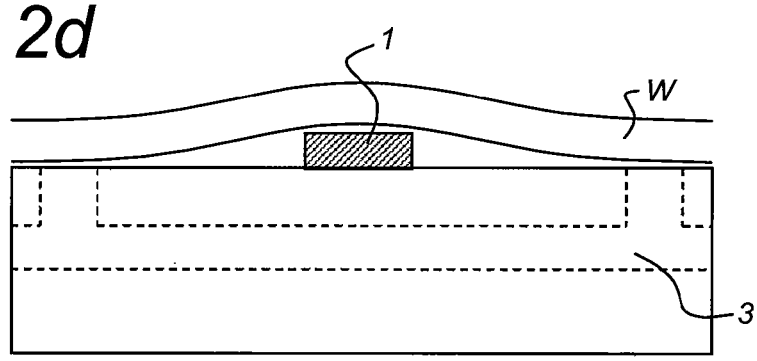
Figure 3:
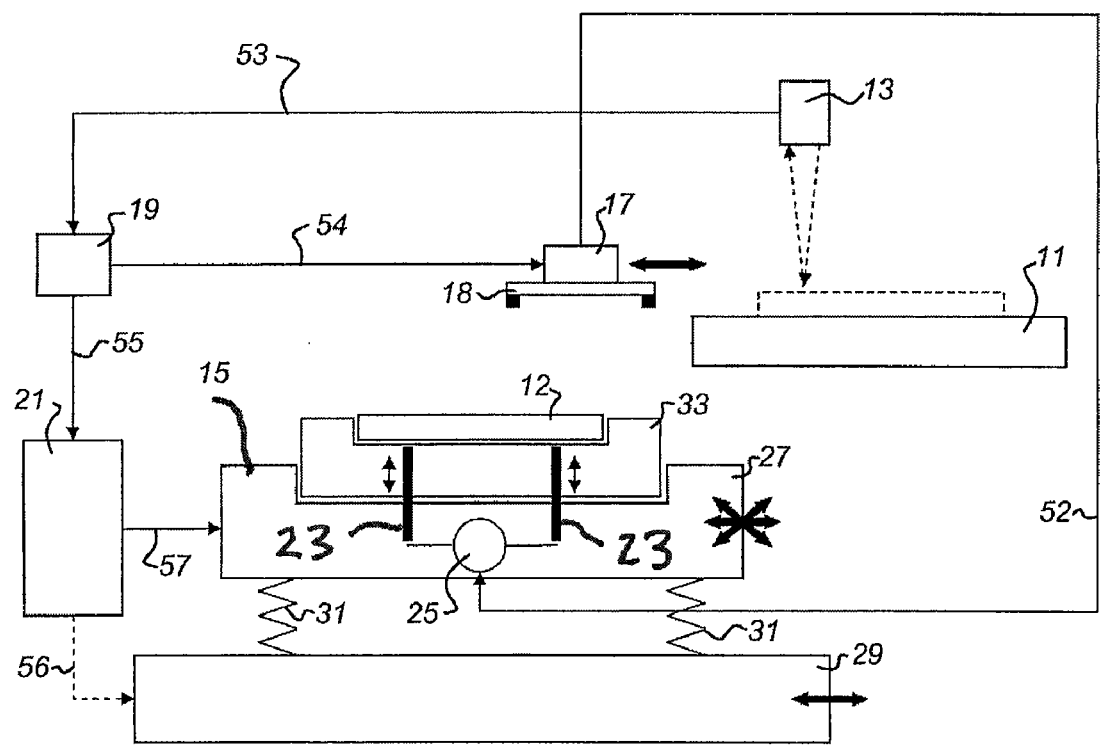
Figure 4:
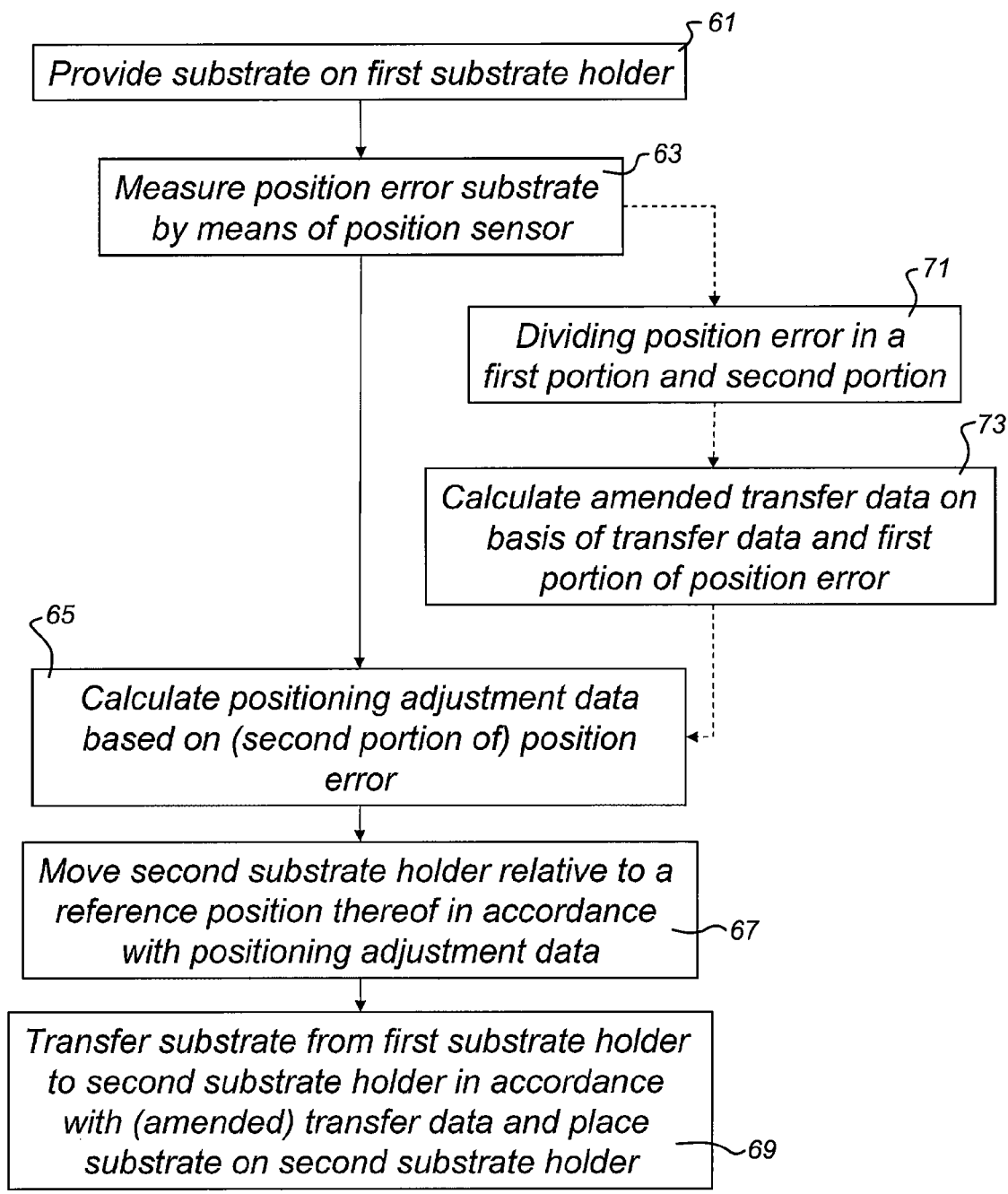
Figure 5:
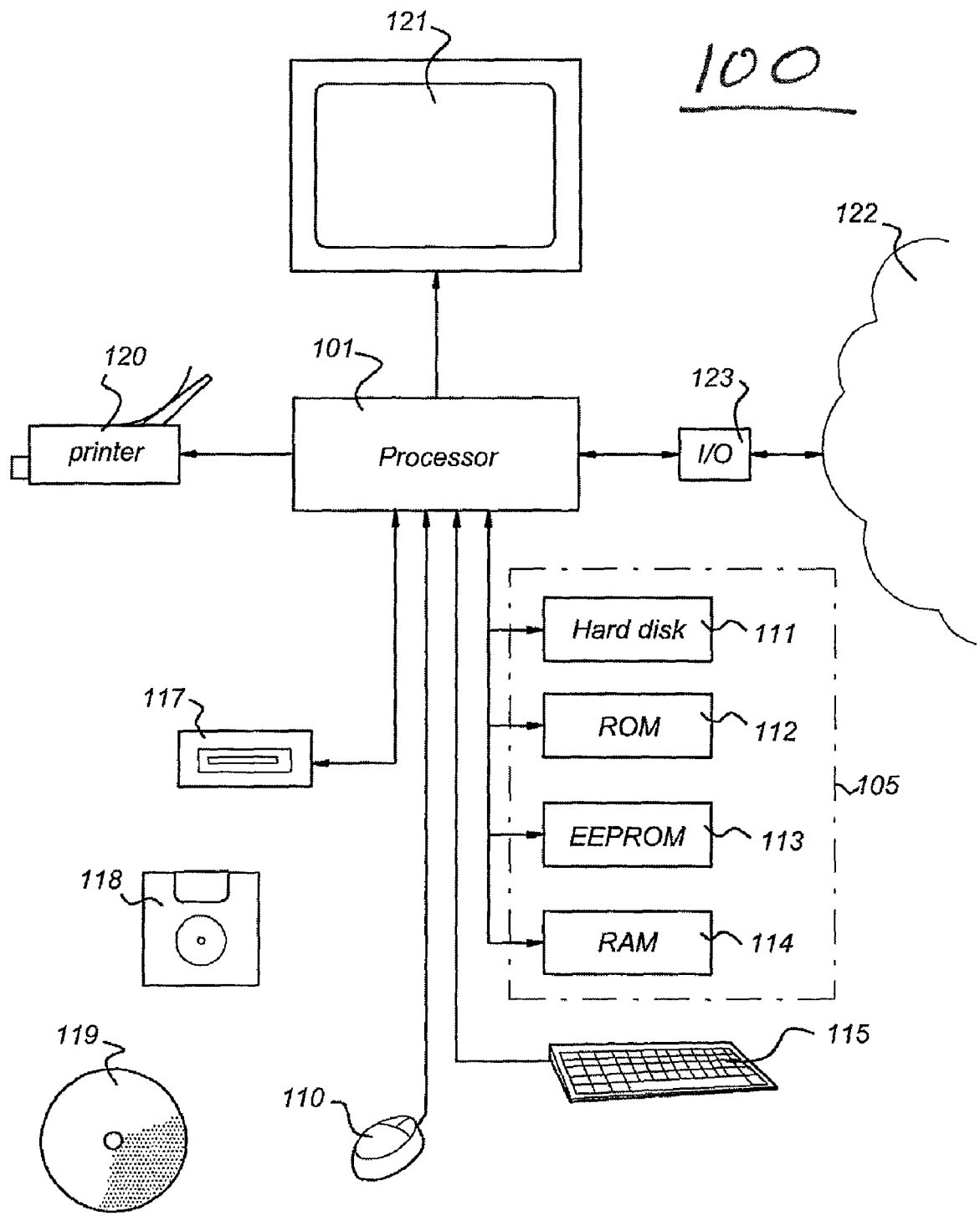

Embodiments of the invention will now be described, by way of example only, with reference to the accompanying schematic drawings in which corresponding reference symbols indicate corresponding parts, and in which:

FIG. 1 depicts a lithographic apparatus according to an embodiment of the invention;

FIGS. 2a-2c schematically depict placement of a substrate on a substrate table as known in the art;

FIG. 2d schematically depicts a detail of a substrate placed on a substrate table as shown in FIG. 2c;

FIG. 3 schematically depicts a transfer system that may be used in embodiments of the invention;

FIG. 4 schematically depicts a method of transferring a substrate from a first substrate holder to a second substrate holder according to embodiments of the invention;

FIG. 5 schematically depicts an embodiment of a computer assembly that may be used in embodiments of the present invention.

DETAILED DESCRIPTION OF THE INVENTION

FIG. 1 schematically depicts a lithographic apparatus according to one embodiment of the invention. The apparatus comprises:

an illumination system (illuminator) IL configured to condition a radiation beam B (e.g., UV radiation or EUV-radiation).

a support structure (e.g., a mask table) MT constructed to support a patterning device (e.g., a mask) MA and connected to a first positioner PM configured to accurately position the patterning device in accordance with certain parameters;

a substrate holder, e.g., a substrate table (e.g., a wafer table) WT, constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is-reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIGS. 2a-2c schematically depict placement of a substrate on a substrate table as known in the art. The substrate table WT is provided with a plurality of protrusions 1, also referred to as pimples or burls. In this document, the expression burl will be used.

As is shown in FIG. 2a, the substrate W is moved towards the substrate table WT until the substrate makes contact with the plurality of burls provided on the surface of the substrate table.

The substrate W now rests on the substrate table WT, its backside being in contact with the plurality of burls 1 on the surface of the substrate table WT, a situation which is schematically depicted in FIG. 2b.

At this stage, air may be sucked away from spaces between the plurality of burls by connecting apertures 3 in the substrate table WT to a vacuum generating device 5. The suction of air is schematically depicted in FIG. 2c by the arrows.

FIG. 2d schematically depicts a detail, i.e., shown in the dashed circle of FIG. 2c, of a substrate W placed on a substrate table WT. Due to the vacuum between the substrate W and the substrate table WT, and the uneven surface of the substrate table WT due to the plurality of burls 1, the substrate W is locally deformed. As a result, an image being exposed on the substrate W will shift locally with respect to the desired image. When the substrate W after development is again positioned on the substrate table WT for a second exposure, due to a different position with respect to the plurality of burls 1, the local image shift will be different during the second exposure than during the first exposure. Consequently, an overlay error has been introduced.

FIG. 3 schematically depicts a transfer system that may be used in embodiments of the invention. The transfer system depicted in FIG. 3 is suitable for use in a lithographic projection apparatus. It is configured to transfer a substrate on the basis of transfer data available thereto. The transfer system comprises a first substrate holder 11, a position sensor 13, a second substrate holder 15, a transfer unit 17, a processor 19 and a control unit 21.

The first substrate holder 11 is configured to hold a substrate 12. In an embodiment, the first substrate holder 11 is rotatable around its center, i.e., the center of the surface on which the substrate can be held. Therefore, an axis of rotation is substantially perpendicular to aforementioned surface.

The second substrate holder 15 is also configured to hold the substrate 12 on a surface thereof. Aforementioned surface of the second substrate holder 15 may be provided with a plurality of burls.

If the transfer system is used in a lithographic projection apparatus, the second substrate holder 15 corresponds to the substrate table WT and the substrate 12 to be held corresponds to substrate W. Furthermore, the first substrate holder 11 may correspond to a substrate table used in a pre-alignment unit.

The position sensor 13 is configured to measure a position error of the substrate 12 positioned on the first substrate holder 11. The position error corresponds to the difference between the measured position of the substrate 12 on the first substrate holder 11 and the desired position of the substrate 12 on the first substrate holder 11. In FIG. 3, the first substrate holder 11 corresponds to a substrate holder in a pre-alignment unit. Such a pre-alignment unit may be used in conjunction with a lithographic projection apparatus to align a substrate 12 in such a way that it can be transferred to the substrate table WT in the lithographic projection apparatus and can be placed thereon within a predetermined area. The position sensor 13 in a pre-alignment unit may be an eccentricity sensor, more particularly an edge sensor. The eccentricity sensor determines the eccentricity of the substrate by measuring the edge of the substrate 12 for different orientations of the substrate 12. In order to enable a measurement on the substrate in different orientations, the substrate table is generally rotatable.

The transfer unit 17 is configured to transfer the substrate 12 from the first substrate holder 11 to the second substrate holder 15. The transfer is executed in accordance with aforementioned transfer data. In the embodiment schematically depicted in FIG. 3, the transfer unit 17 comprises two sub-units, i.e., a gripper unit 18 configured to pick up the substrate 12 from the first substrate holder 11 and move the substrate 12 towards the second substrate holder 15, and three or more extendable pins residing in the second substrate table 15, so-called E-pins 23. The position and movement of the E-pins 23 may be controlled by an E-pins actuator 25, e.g., a Lorentz motor, which in its turn may be controlled by local electronics. As a safety measure on power failure occurrences, the E-pins 23 may be configured to fall to their lowest position by the natural force of gravity. This may ensure that the E-pins 23 are not to be damaged. The transfer unit 17 may now be arranged to control movement of the substrate 12 held by the gripper unit 18 in cooperation with movement of the E-pins 23, schematically depicted by means of line 52. The transfer unit 17 may control movement of the gripper unit 18 in a direction towards the E-pins 23, in FIG. 3, a movement to the left, such that the substrate 12 is positioned suitably above the E-pins 23. The transfer unit 17 may then control extension of the E-pins towards the substrate 12, in FIG. 3 upwards, until they make contact with the substrate 12. The transfer unit 17 subsequently controls detachment of the substrate 12 from the gripper unit 18 and subsequent movement of the gripper unit 18 away from the E-pins 23, e.g., in FIG. 3 a movement to the right until the gripper unit 18 no longer blocks a movement of the substrate 12 towards the second substrate holder 15. Finally, the transfer unit 17 may control retraction of the E-pins 23 until the substrate 12 is positioned on the second substrate holder 15.

The processor 19 is communicates with position sensor 13. The processor 19 is configured to calculate positioning adjustment data based on the position error as measured by and received from the position sensor 13, schematically depicted by a signal line 53. In an embodiment, the processor 19 is further configured to divide the position error as measured in a first portion and a second portion, calculate amended transfer data on the basis of the transfer data and the first portion of the position error, and calculate positioning adjustment data based on the second portion of the position error as measured. In this embodiment, the transfer unit 17, which communicates with processor 19, is configured to transfer the substrate 12 from the first substrate holder 11 to the second substrate holder 15 in accordance with aforementioned amended transfer data. The communication of aforementioned amended transfer data from the processor 19 towards the transfer unit 17 is in FIG. 3 schematically depicted by signal line 54.

The control unit 21 communicates with the processor 19 via a signal line 55. The control unit 21 is configured to move the second substrate holder 15 relative to a reference position thereof in accordance with the positioning adjustment data as calculated with the processor 19. The communication of the positioning adjustment data from the processor 19 towards the control unit is in FIG. 3 schematically depicted by signal line 55.

It should be understood that, although in FIG. 3 the processor 19 and the control unit 21 are depicted as separate elements, the processor 19 may be incorporated in the control unit 21, e.g., in case the control unit 21 takes the form of a computer assembly as described with reference to FIG. 5.

Positioning of a substrate table WT in a lithographic projection apparatus is generally implemented by a so-called long-stroke stage module and a so-called short-stroke stage module, in FIG. 3 indicated by reference number 27 and 29 respectively. The combined positioning ability of theses two stage modules 27, 29 provides an accurate and fast positioning. The long-stroke stage module 29 generally provides coarse positioning and movement of the short-stroke stage module 27 in a number of directions, generally three. The short-stroke stage module 27 generally provides accurate movement and positioning of a substrate W placed thereon in six degrees of freedom. The short-stroke stage module 27 may be separated from the long-stroke stage module 29 by means of air bearings 31 and may be driven by one or more Lorentz motors (not shown).

The control unit 21 may comprise separate control modules to control movement and positioning of the short-stroke stage module 27 and the long-stroke stage module 29 separately. In embodiments of the invention related to a transfer system in a lithographic projection apparatus, when reference is made to the control unit 21 being configured to control movement of the second substrate holder 15 in accordance with the positioning adjustment data as calculated with the processor 19, actually the control module configured to control the movement and positioning of the short-stroke stage module 27 is addressed. Alternatively, the same control unit 21 may be configured to control movement and positioning of both the long-stroke stage module 29 and the short-stroke stage module 27, this situation being depicted in FIG. 3 by lines 56 and 57, respectively. However, also in this case, most accurate results are obtained when the positioning adjustment data relate to movement of the short-stroke stage module 27.

As schematically depicted in FIG. 3, the second substrate table 15 may not only comprise a short-stroke stage module 27, but also an additional element 33. The additional element may be provided with a recess area sufficiently large to accommodate the substrate 12. The surface of the recess may comprise a plurality of burls and be provided with apertures between said plurality of burls for the purpose of establishing a vacuum environment as discussed with reference to FIGS. 2a-d. In immersion lithographic projection apparatus, the recess in the additional element 33 may also have the purpose of containing and controlling immersion fluid.

FIG. 4 schematically depicts a method of transferring a substrate from a first substrate holder to a second substrate holder according to embodiments of the invention. The transfer is performed by a transfer unit on the basis of transfer data available thereto.

First, the substrate is provided on the first substrate holder in action 61. Then, in action 63, a position error of the substrate is measured by means of a position sensor.

In an embodiment, the position error is an eccentricity error. In this embodiment, the position sensor comprises an eccentricity sensor.

In another embodiment, the position error is dissectible in an eccentricity error and an orientation error In such an embodiment, the position sensor may comprise an eccentricity sensor configured to measure the eccentricity error and an orientation sensor configured to measure the orientation error, i.e., an error between the orientation of the substrate while being provided on the first substrate table and a desired orientation of the substrate on the first substrate table. Alternatively, there is a single sensor, often denoted as edge sensor. The edge sensor may be configured transform measured edge data, i.e., measurement of a substrate radius during rotation which produces a sinus, to eccentricity data, i.e., data representing an offset of aforementioned sinus, and orientation, i.e., location of a specific element of the substrate, e.g., a notch, in aforementioned sinus.

Subsequently, in action 65, positioning adjustment data are calculated, the positioning adjustment data being based on the position error as measured.

Then, in action 67, the second substrate holder is moved relative to a reference position thereof. Movement of the second substrate holder such that the second substrate holder is placeable at aforementioned reference position may be performed by controlling movement of a long stroke module in combination with a short stroke module like long stroke module 29 and short stroke module 27 depicted in FIG. 3 respectively, as will be known to a person skilled in the art. In case of a lithographic projection apparatus as shown in FIG. 3, the reference position corresponds with a position in which the substrate would be positioned on top of the e-pins in a substantially centered position in case no translational offset is present. In an embodiment, the movement relative to that reference position is performed by controlling movement of the short stroke module, e.g., short stroke module 27 as depicted in FIG. 3, alone. The movement relative to the reference position of the second substrate holder is performed in accordance with the positioning adjustment data as calculated. It should be understood that the movement is not necessarily limited to translations in a direction parallel to the surface of the substrate holder holding the substrate. In embodiments of the invention, also rotational movements may be performed, e.g., to compensate for an orientation error of the substrate on the first substrate table.

Finally, in action 69, the substrate is transferred using the transfer unit form the first substrate holder to the second substrate holder in accordance with the transfer data and placed on the second substrate holder as moved.

In an embodiment, after measuring the position error in action 63, first, in action 71, the position error as measured is divided in a first portion and a second portion. Amended transfer data are then calculated in action 73 on the basis of the transfer data and the first portion of the position error. Subsequently, in action 65, calculating positioning adjustment data is now based on the second portion of the position error. Further note that transferring the substrate from the first substrate holder to the second substrate holder in action 69, now takes place in accordance with amended transfer data.

Dividing the position error in a first portion and a second portion may follow the following procedure. If the position error remains below a predetermined threshold error, the entire position error may be assigned to the first portion. Otherwise, i.e., if the position error exceeds the predetermined threshold error, the predetermined threshold error is assigned to the first portion and a difference between the entire position error and the predetermined threshold error is assigned to the second portion.

FIG. 5 schematically depicts an embodiment of a computer assembly that may be used in embodiments of the present invention. Such a computer assembly 100 may be a dedicated computer in the form of a control unit, e.g., control unit 21. The computer assembly 100 may be arranged for loading a computer readable medium encoded with computer executable code. This may enable the computer assembly 100 to execute, when the computer executable code on the computer readable medium is loaded, embodiments of aforementioned method of transferring a substrate from a first substrate holder to a second substrate holder using a transfer unit based on transfer data available thereto Additionally or alternatively, this may enable the computer assembly 100 to execute, when the computer readable medium is loaded, a device manufacturing method in which a target portion of a substrate is patterned by way of embodiments of a lithographic projection apparatus comprising such a transfer system.

The computer assembly 100 comprises a processor 101, e.g., processor 19 in communication with control unit 21, and a may further comprise a memory 105. The memory 105, which is connected to processor 101, may comprise a number of memory components like a hard disk 111, Read Only Memory (ROM) 112, Electrically Erasable Programmable Read Only Memory (EEPROM) 113 en Random Access Memory (RAM) 114. Not all aforementioned memory components need to be present. Furthermore, it is not essential that aforementioned memory components are physically in close proximity to the processor 101 or to each other. They may be located at a distance away The processor 101 may also be connected to some kind of user interface, for instance a keyboard 115 or a mouse 110. A touch screen, track ball, speech converter or other interfaces that are known to persons skilled in the art may also be used.

The processor 101 may be connected to a reading unit 117, which is arranged to read data, e.g., in the form of computer executable code, from and under some circumstances store data on a computer readable medium, like a floppy disc 118 or a CDROM 119. Also DVD's or other computer readable media known to persons skilled in the art may be used.

The processor 101 may also be connected to a printer 120 to print out output data on paper as well as to a display 121, for example a monitor or LCD (Liquid Crystal Display), of any other type of display known to a person skilled in the art.

The processor 101 may be connected to a communications network 122, for instance a public switched telephone network (PSTN), a local area network (LAN), a wide area network (WAN) etc. by way of transmitters/receivers responsible for input/output (I/O) 123. The processor 101 may be arranged to communicate with other communication systems via the communications network 122. In an embodiment of the invention external computers (not shown), for instance personal computers of operators, can log into the processor 101 via the communications network 122.

The processor 101 may be implemented as an independent system or as a number of processing units that operate in parallel, wherein each processing unit is arranged to execute sub-tasks of a larger program. The processing units may also be divided in one or more main processing units with several subprocessing units. Some processing units of the processor 101 may even be located a distance away of the other processing units and communicate via communications network 122.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled person will appreciate that, in the context of such alternative applications, any use of the terms "wafer" or "die" herein may be considered as synonymous with the more general terms "substrate" and "target portion", respectively. The substrate referred to herein may be processed before or after exposure, in for example a track (a tool that typically applies a layer of resist to a substrate and develops the exposed resist), a metrology tool and/or an inspection tool. where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 355, 248, 193, 157 or 126 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of transferring a substrate from a first substrate holder to a second substrate holder, using a transfer unit, based on transfer data available thereto, the method comprising:
   providing said substrate on said first substrate holder;
   measuring a position error of said substrate;
   calculating positioning adjustment data based on said position error as measured;
   moving said second substrate holder relative to a reference position thereof in accordance with said positioning adjustment data; and
   transferring the substrate using said transfer unit from the first substrate holder to the second substrate holder in accordance with said transfer data and placing said substrate on said second substrate holder as moved.

2. The method according to claim 1, further comprising, after said measuring:
   dividing said position error as measured in a first portion and a second portion;
   calculating amended transfer data based on said transfer data and said first portion of the position error; and
   wherein said calculating positioning adjustment data is based on said second portion of the position error as measured and said transferring is performed in accordance with said amended transfer data.

3. The method according to claim 2, wherein said dividing is performed by:
   assigning the entire position error to the first portion if the position error remains below a predetermined threshold error; and otherwise
   assigning the predetermined threshold error to the first portion and assigning the difference between the entire position error and the predetermined threshold error to the second portion.

4. The method according to claim 1, wherein the position error is an eccentricity error measured by an eccentricity sensor.

5. The method according to claim 1, wherein the position error is dissectible in an eccentricity error measured by an eccentricity sensor and an orientation error measured by an orientation sensor.

6. A computer readable medium having computer executable code stored thereon, which, when loaded on a computer assembly, enables the computer assembly to control a method of transferring, using a transfer unit, based on transfer data available thereto, the method comprising:
   providing said substrate on said first substrate holder;
   measuring a position error of said substrate;
   calculating positioning adjustment data based on said position error as measured;
   moving said second substrate holder relative to a reference position thereof in accordance with said positioning adjustment data; and
   transferring the substrate using said transfer unit from the first substrate holder to the second substrate holder in accordance with said transfer data and placing said substrate on said second substrate holder as moved.

7. A transfer system for transferring a substrate on the basis of transfer data available thereto, the transfer system comprising:
   a first substrate holder configured to hold the substrate;
   a position sensor configured to measure a position error of said substrate positioned on said first substrate holder;
   a second substrate holder configured to hold the substrate;
   a transfer unit configured to transfer said substrate from the first substrate holder to the second substrate holder in accordance with said transfer data;
   a processor communicated to said position sensor and configured to calculate positioning adjustment data based on said position error as measured;
   a control unit communicated to said processor and configured to move said second substrate holder relative to a reference position thereof in accordance with said positioning adjustment data as calculated.

8. The transfer system according to claim 7, wherein said second substrate holder is positioned on a first moveable stage module, and said first moveable stage module is positioned on a second moveable stage module, both said first and second moveable stage modules being communicated to said control unit, the control unit further being configured to move said second moveable stage module and said first moveable stage such that said second substrate holder may be placed at said reference position, and further being configured to move said first moveable stage module such that said second substrate holder moves relative to said reference position in accordance with said position adjustment data as calculated.

9. The transfer system according to claim 7, wherein said processor is further configured to:
  divide the position error as measured in a first portion and a second portion;
  calculate amended transfer data on the basis of the transfer data and the first portion of the position error; and
  calculate positioning adjustment data based on the second portion of the position error as measured;
  and wherein said transfer unit is communicated to said processor and configured to transfer said substrate from the first substrate holder to the second substrate holder in accordance with said amended transfer data.

10. The transfer system according to claim 7, wherein said position sensor comprises an eccentricity sensor configured to measure an eccentricity error.

11. The transfer system according to claim 10, wherein said position sensor further comprises an orientation sensor configured to measure an orientation error.

12. The transfer system according to claim 7, wherein said first substrate table is rotatable around its center.

13. The transfer system according to claim 7, wherein said transfer unit comprises at least three extendable pins located in said second substrate table.

14. The transfer system according to claim 13, wherein said transfer system further comprises an actuator configured to control extension of said at least three extendable pins.

* * * * *